United States Patent [19]

White

[11] 4,159,501
[45] Jun. 26, 1979

[54] METHOD AND APPARATUS FOR INDICATING THE LEAKAGE RESISTANCE IN AN ELECTRICAL SYSTEM

[75] Inventor: Orval C. White, Spencer, Okla.

[73] Assignee: Kerr-McGee Nuclear Corporation, Oklahoma City, Okla.

[21] Appl. No.: 562,583

[22] Filed: Mar. 27, 1975

[51] Int. Cl.$^2$ .............................................. H02H 3/16
[52] U.S. Cl. ........................................ 361/47; 361/42; 324/51
[58] Field of Search ............... 317/18 D, 18 R, 18 C, 317/13 R; 324/51; 340/255; 361/42, 47–50

[56] References Cited

U.S. PATENT DOCUMENTS

| | | | |
|---|---|---|---|
| 3,058,035 | 10/1962 | Brown | 317/18 D |
| 3,286,129 | 11/1966 | Gagniere | 317/18 D |
| 3,376,476 | 4/1968 | Porterfield et al. | 317/18 R |
| 3,483,470 | 12/1969 | Tsergas | 324/51 |
| 3,492,567 | 1/1970 | Rissolo | 340/255 X |
| 3,656,136 | 4/1972 | Blair | 317/18 R X |
| 3,665,252 | 5/1972 | Rogers et al. | 317/18 D |
| 3,666,993 | 5/1972 | Legatti | 317/18 R |
| 3,757,169 | 9/1973 | Beresnikow | 317/18 R |
| 3,764,853 | 10/1973 | Beachley, Jr. | 317/18 D |
| 3,836,844 | 9/1974 | Prugh | 324/51 |

FOREIGN PATENT DOCUMENTS 65218  2/1956  France ........................................ 317/31

Primary Examiner—Patrick R. Salce
Attorney, Agent, or Firm—William G. Addison

[57] ABSTRACT

The present invention contemplates an improved method and control apparatus for indicating the leakage resistance in an electrical system wherein the electrical system generally includes an alternating current power source connected to a load via a conductor assembly, and wherein the control apparatus generally includes: a direct current power source connected to the electrical system for impressing a direct current control signal on the electrical system, and a portion providing an output indication of the leakage resistance in the electrical system.

3 Claims, 1 Drawing Figure

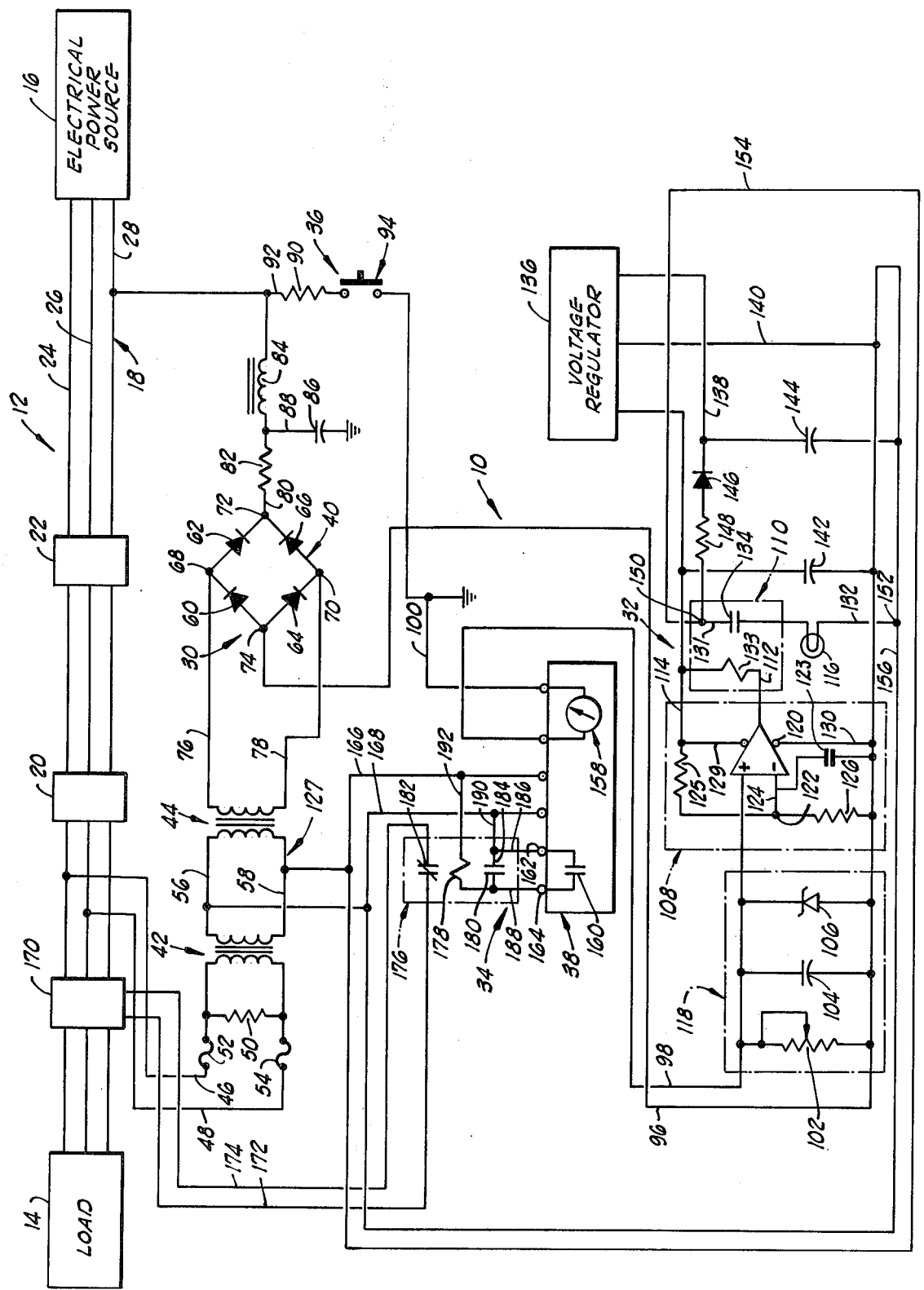

METHOD AND APPARATUS FOR INDICATING THE LEAKAGE RESISTANCE IN AN ELECTRICAL SYSTEM

BACKGROUND OF THE INVENTION

1. Field of the Invention

The present invention relates generally to a method and apparatus for indicating parameters in an electrical system and, more particularly, but not by way of limitation, to a method and an apparatus for indicating the leakage resistance to ground in an alternating current electrical system.

2. Brief Description of the Prior Art

In the past, various monitoring, controlling and indicating devices have been constructed to sense, detect, indicate or measure various parameters of an electrical system, such as the leakage resistance or leakage current to ground, earth faults, overloads, conductor continuity and the like, for example. Most electrical power distribution systems have included devices designed to disconnect the load from the power source in response to a predetermined overload or the like. However, in general, such prior art devices have a relatively slow response time and, in most instances, such devices have disconnected the electrical power source from the load only after the condition had resulted in relatively severe damage to defective equipment.

For example, with respect to electrical systems including an electric motor, the insulation surrounding the motor windings may become worn causing a leakage current between the motor windings and ground via the worn or defective insulation and, when the leakage current increases to a certain high leakage current value, the motor windings short to ground resulting in relatively severe damage to the motor windings. Such severe damage to the motor windings generally results in a relatively expensive repair. In most instances, if the leakage current could have been detected before reaching such a relatively high value and if the motor could have been disconnected from the electrical power source substantially immediately upon detection of the leakage current, the defect causing the leakage current could be repaired in a substantially less expensive manner as compared to the repair expense involved in replacing the damaged motor windings. The above-discussed rationale would be applicable to the various other components in the electrical system, such as the service conductors, the transformers, the electrical power source, the controller and the like, for example.

The leakage current in an alternating current electrical system causes an unbalanced condition between the individual service conductors and this unbalanced condition has been utilized in the past to indicate the leakage current in the electrical system. However, there is an inherent unbalanced condition in most alternating current electrical systems and this inherent unbalanced condition can affect the reliability of such systems. The U.S. Pat. No. 3,252,052, issued to Nash, disclosed a leakage current detection device utilizing the unbalanced condition in the service conductors to indicate leakage current. The U.S. Pat. No. 3,165,671, issued to Mintz et al., also disclosed a device capable of responding to a unbalanced condition in a polyphase system.

Some ground sensing devices constructed in the past have developed a direct current power source utilizing the available alternating current power source and the developed direct current power source has been utilized in the control ground sensing apparatus, such as the U.S. Pat. No. 3,058,035, issued to Brown. The U.S. Pat. No. 3,308,346, issued to Martzloff et al., disclosed a fault detector wherein a direct current was circulated through a conductive loop and a bridge circuit was utilized for comparing the value of the circulating direct current in the conductive loop to a reference value, a pilot conductor and a ground conductor being utilized to establish the conductive loop.

The U.S. Pat. No. 3,158,785, issued to Gagniere et al., disclosed a fault detector utilizing the unbalanced condition or a supervisory direct current injected between the network and ground. Other prior fault detectors, leakage detectors, ground detectors, safety circuits and the like were disclosed in the following U.S. Pat. Nos. 1,648,694, issued to Merrick; 1,826,965, issued to Stryker; 2,079,636, issued to Sharp; 2,147,101, issued to Leyburn; 2,157,886, issued to Cuttino; 2,224,320, issued to Schweitzer, Jr.; 2,238,570, issued to Schweitzer, Jr.; 2,428,563, issued to Fountain; 2,585,734, issued to Bucher; 2,660,717, issued to Hood; 2,697,217, issued to Jeffers; 2,700,125, issued to King et al.; 2,844,765, issued to Sosnoski; 2,883,610, issued to Brown; 3,187,225, issued to Mayer; 3,202,875, issued to Bateman; 3,213,321, issued to Dalziel; 3,214,638, issued to Moser; 3,229,163, issued to Rogers, Sr.; 3,335,324, issued to Buckeridge; 3,505,566, issued to Conrad; 3,515,941, issued to Moore et al.; 3,617,836, issued to Henry; 3,638,072, issued to Kobayashi et al.; 3,697,809, issued to Self; 3,754,221, issued to Stelter.

SUMMARY OF THE INVENTION

The present invention provides a method and a control apparatus for indicating the leakage resistance or leakage current of an electrical system having an alternating current power source connected to a load via a conductor assembly, the control apparatus having a relatively short response time and being responsive to relatively small leakage current values. The control apparatus includes a direct current power source connected to the electrical system for impressing a direct current control signal on the electrical system, the control apparatus being responsive to and providing output indications of the leakage current or leakage resistance of the electrical system. In one form, the control apparatus provides an output indication in response to a predetermined first leakage resistance in the electrical system and another output indication in response to a predetermined second leakage resistance in the electrical system, the second leakage resistance being less than the first leakage resistance. In this last-mentioned form, the control apparatus, more particularly, provides a signal warning of a condition causing a lowering of the leakage resistance in response to the first leakage resistance in the electrical system and a signal for disconnecting the alternating current power source from the load in response to the second leakage resistance in the electrical system.

BRIEF DESCRIPTION OF THE DRAWING

The single drawing diagrammatically and schematically shows the control apparatus of the present invention connected to an electrical system, the drawing also being utilized herein to describe the method of the present invention.

DESCRIPTION OF THE PREFERRED EMBODIMENT

Referring to the drawing, shown therein and designated via the general reference numeral 10 is a control apparatus constructed in accordance with the present invention. The control apparatus 10 is connected to an electrical system 12, which includes a load 14 connected to an electrical power source 16 via a conductor assembly 18. The control apparatus 10 applies a control signal to the electrical system 12 and provides output indications indicating the leakage resistance or leakage current of the electrical system 12. In one preferred embodiment, as shown in the drawing, the control apparatus 10 provides a first signal in response to a predetermined first leakage resistance in the electrical system 12 and a second signal in response to a predetermined second leakage resistance in the electrical system 12, the second leakage resistance being lower or less than the first leakage resistance.

In general, the electrical system 12 is constructed to have a substantially high resistance to ground. However, various conditions can exist which would result in a lowering of the resistance to ground in the electrical system 12, such as a deterioration or wearing causing a breakdown of the electrical insulation in the load 14 or in the electrical power source 16 or in the conductors 18 or in the various protection devices generally interposed in the conductor assembly 18, such as a circuit breaker or an overload protection device, for example (a circuit breaker 20 and an overload protection device 22 being schematically shown in the drawing). The resistance to ground of the electrical system 10 is generally referred to in the art and herein as the "leakage resistance," and the stray current which flows to ground, such as through or across an insulator or the like, for example, is generally referred to in the art and herein as the "leakage current," the leakage resistance being the path over which the leakage current flows. Thus, the leakage current and the leakage resistance are related and a decrease in the leakage resistance results in a corresponding increase in the leakage current, the relationship between the leakage current and the leakage resistance being substantially linear. Therefore, the first leakage resistance has a corresponding first leakage current and the second leakage resistance has a corresponding second leakage current. Further, a measuring, a sensing, a detecting or the like of the leakage current necessarily involves and is intended to encompass a measuring, a sensing, a detecting or the like of the leakage resistance, and, by the same token, an indication or an output indication or the like of the leakage current necessarily involves and is intended to encompass an indication or an output indication or the like of the leakage resistance.

In a preferred embodiment, the control apparatus 10 is constructed to protect the electrical system 12 in a manner reducing the damage to the various components of the electrical system 12 resulting from excessive leakage currents by continuously monitoring and sensing or detecting the leakage current of the electrical system 12 and providing the first and the second signals at predetermined leakage current values which are less than the leakage current value at which excessive damage generally occurs to the components of the electrical system 12. More particularly, the control apparatus 10 provides the first signal in response to a first leakage resistance in the electrical system 12 for producing a warning indicating the existence of a condition in the electrical system 12 which probably will result in a continually decreasing leakage resistance or, in other words, a continually increasing leakage current, and the control apparatus 10 provides the second signal in response to a second leakage resistance in the electrical system 12 for producing an output signal indicating that the leakage current in the electrical system 12 is at a sufficiently high level to warrant the immediate disconnecting of the electrical power source 16 from the load 14, the control apparatus 10 being constructed to effect the disconnecting of the electrical power source 16 from the load 14 in response to the second signal in one embodiment shown in the drawing.

The control apparatus 10 has a relatively short response time and is responsive to relatively low leakage current values so the various components of an electrical system can be disconnected from the electrical power source in response to a leakage resistance in the electrical system which is higher than the leakage resistance value at which damaging excessive leakage currents normally occur and so a warning indication may be provided to effect the more efficient scheduling of repairs and maintenance. The control apparatus 10 can be utilized in conjunction with electrical systems having a voltage level generally above ground potential, for example, and in cooperation with such electrical components or devices as single phase motors, three phase motors, motor control centers, feeder circuits, branch circuits, control circuits and power supply sources, the electrical system 12 being diagrammatically shown in the drawing for the purpose of illustrating the method of the present invention and the operation of the control apparatus 10. As schematically shown in the drawing, the conductor assembly 18, more particularly, comprises three conductors 24, 26 and 28 and the control apparatus 10 of the present invention is particularly suitable for monitoring and sensing the leakage current of the electrical system 12 wherein the electrical power source 16, more particularly, is an alternating current type of power source and the load 14, more particularly, is an electric motor or other such load requiring an electrical power source for operation.

The control apparatus 10 includes: a direct current power source 30 connected to the conductor assembly 18 for impressing the direct current control signal on the electrical system 12; a first signal generating assembly 32 connected to the electrical system 12 for sensing the leakage current and providing the first signal in response to the first leakage resistance value; a second signal generating assembly 34 connected to the electrical system 12 for sensing the leakage current and providing the second signal in response to the second leakage resistance value; and a test assembly 36 connectable to the electrical system 12 in one condition of the control apparatus 10 thereby connecting a test resistance to the electrical system 12 having a resistance value substantially equal to the second leakage resistance value for testing the operation of the second signal generating assembly 34.

The direct current power source 30, more particularly, includes a bridge rectifier 40, a first transformer 42, and a second transformer 44. The primary terminals of the first transformer 44 are connected to the conductor assembly 18 via a pair of conductors 46 and 48, one of the primary terminals being connected to the conductor 24 via the conductor 46 and the other primary terminal being connected to the conductor 26 via the conductor 48. A resistor 50 is connected in electrical parallel with the primary windings of the first transformer 42 to limit the current flowing through the primary windings of the first transformer 42 to a predetermined value for preventing excessive heating of the first transformer 42 windings. A fuse 52 is interposed in the conductor 46 and a fuse 54 is interposed in the conductor 48, the fuses 52 and 54 being interposed between the first transformer 42 and the conductor assembly 18 for interrupting electrical continuity between the first transformer 42 and the electrical power source 16 if the current through either of the conductors 46 or 48 exceeds the predetermined current rating of the fuses 52 and 54.

The first transformer 42, more particularly, is of the type generally referred to in the art as a "step-down" type of transformer and is constructed to provide a predetermined voltage at the secondary terminals thereof, the alternating current signal at the secondary terminals of the first transformer 42 providing an operating electrical power supply for operating various relays or other such components in one aspect of the present invention. The secondary terminals of the first transformer 42 are connected to the primary terminals of the second transformer 44 via conductors 56 and 58 and the second transformer 44 provides a predetermined voltage at the secondary terminals for supplying a predetermined alternating current voltage to the bridge rectifier 40.

The bridge rectifier 40 receives the signal from the second transformer 44 and provides the direct current control signal. More particularly, the bridge rectifier 40 includes four diodes 60, 62, 64 and 66 connected to a pair of input terminals 68 and 70 and to a pair of output terminals 72 and 74 in a bridge configuration, the cathode of the diode 60 and the anode of the diode 62 each being connected to the input terminal 68, the cathode of the diode 64 and the anode of the diode 66 each being connected to the input terminal 70, the cathode of the diode 62 and the cathode of the diode 66 each being connected to the output terminal 72, and the anode of the diode 60 and the anode of the diode 64 each being connected to the output terminal 74. The alternating current signal is applied at the input terminals 68 and 70 and, more particularly, one of the secondary terminals of the second transformer 44 is connected to the input terminal 68 via a conductor 76 and the other secondary terminal of the second transformer 44 is connected to the input terminal 70 via a conductor 78.

The bridge rectifier 40 provides the direct current signal via the output terminals 72 and 74. The positive side of the direct current power source 30 (the output terminal 72) is connected to one of the conductor assemblies 18 via a conductor 80 thereby connecting a direct current control signal to the electrical system 12, the direct current control signal being connected to and impressed on each conductor of the conductor assembly 18, the circuit breaker 20, and the overload protection device 22 through the electrical power source 16 and the load 14.

A resistor 82 and a choke coil 84 are each interposed in the conductor 80 between the direct current power source 30 and the electrical system 12 and one side of a capacitor 86 is connected via a conductor 88 to the conductor 80, generally between the resistor 82 and the choke coil 84, the opposite side of the capacitor 86 being connected to ground. The capacitor 86 has a predetermined voltage rating and functions to essentially block or prevent the flow of direct current to ground while creating a low resistance to ground for alternating current thereby blocking the alternating current from the direct current power source 40. The choke coil 84 substantially suppresses the flow of alternating current without appreciable affect on the flow of direct current thereby substantially isolating the control apparatus 10 from the alternating current electrical system 12 while allowing the direct current control signal to be applied to the electrical system 12 via the conductor 80.

A test resistor 90 is connected to the positive side of the direct current power source 30 via a conductor 92, the conductor 92 being connected to the conductor 80 generally between the choke coil 84 and the electrical system 12. A normally open, push-button type of test switch 94 is interposed in the conductor 92 and the end of the conductor 92, opposite the end connected to the direct current power source 30, is connected to ground. The test resistor 90 and the test switch 94 comprise the test assembly 36. Thus, in the one normally open position of the test switch 94, electrical continuity is interrupted in the conductor 92 and the test resistor 90 is not effectively interposed in the control apparatus 10. In the depressed position of the test switch 94, electrical continuity is established between the positive side of the direct current power source 30 and ground via the conductors 92 and 80, thereby connecting the test resistor 90 in electrical series to the positive side (the output terminal 72) of the direct current power source 30. The test resistor 90 has a predetermined resistance value substantially equal to the second leakage resistance value and, in the depressed position of the test switch 94, the test assembly 36 connects a resistance (the test resistor 90) to the control apparatus 10 substantially equal to the second leakage resistance value which should cause the second signal generating assembly 34 to generate and produce the second signal, assuming the control apparatus 10 is functioning in a proper manner. Thus, the test assembly 36 provides a fast, effective, and efficient test of the operation of the control apparatus 10 in a manner such that the normal operation does not have to be interrupted for an extended period and such that the control apparatus 10 does not have to be disconnected from the electrical system.

The first and the second signal generating assemblies 32 and 34 are each connected in electrical series with the direct current power source 30 and the electrical system 12, and the current flowing through the first and the second signal generating assemblies 32 and 34 is a function of the leakage resistance of the electrical system 12, i.e. the leakage resistance of the electrical system 12 is in electrical series with the first and the second signal generating assemblies 32 and 34 and the direct current power source 30. More particularly, the negative side of the direct current power source 30 is connected in electrical series to the first signal generating assembly 32 via a conductor 96, the first signal generating assembly 32 is connected in electrical series to the second signal generating assembly 34 via a conductor 98 and the second signal generating assembly 34 is connected to ground via a conductor 100, the leakage resistance in the electrical system 12 being connected to ground.

The first signal generating assembly 32 includes: a variable resistor 102 connected to the conductors 96 and 98; a filter capacitor 104 connected to the conductors 96 and 98 in electrical parallel with the variable resistor 102; a Zener diode 106 connected to the conductors 96 and 98 in electrical parallel with the variable resistor 102 and the filter capacitor 104; a voltage comparator 108 connected to the conductors 96 and 98, receiving the input signal developed via the leakage current flowing through the variable resistor 102, providing an output signal in the "low" state in response to a received input signal indicating a leakage resistance above the predetermined first leakage resistance in the electrical system 12, the voltage comparator 108 output signal being switched to the "high" state in response to a received input signal indicating the predetermined first leakage resistance in the electrical system 12; a relay 110 connected to the voltage comparator 108 via a pair of conductors 112 and 114 for receiving the output signal provided via the voltage comparator 108, the relay 110 having an energized and a de-energized condition; and an indicator lamp 116 connected to the relay 110, the lamp 116 being illuminated in an energized condition of the relay 110. The signal indicative of the leakage resistance in the electrical system 12 is received and amplified by the voltage comparator 108 and the voltage comparator 108 output signal is applied to the relay 110, the relay 110 being energized when the voltage comparator 108 output signal is in the "high" state indicating a signal is being received by the first signal generating assembly 32 as a result of a leakage resistance in the electrical system 12 substantially equal to the first leakage resistance value and causing the indicator lamp 116 to be illuminated thereby providing a perceivable output indication indicating that a leakage current is flowing through the electrical system 12 substantially equal to the first leakage current value, i.e. the electrical system 12 has a leakage resistance substantially equal to the first leakage resistance value. In this embodiment of the invention, the first signal generated and provided via the first signal generating assembly 32 includes the voltage comparator 108 output signal and the perceivable output indication provided via the illumination of the lamp 116, the first signal also encompassing the energizing of the relay 110 in one aspect. It should be noted that the voltage comparator 108 output signal can be connected to various output indicating or monitoring type devices, such as alarms, for example, if desired in a particular application.

The variable resistor 102, the filter capacitor 104 and the Zener diode 106 comprise an input network 118 for connecting the received direct current signal to the input of the voltage comparator 108. The variable resistor 102, more particularly, allows the input signal to the voltage comparator 108 to be varied, thereby controlling the required minimum input signal for producing an amplified output signal in the "high" state having a sufficient amplitude for energizing the relay 110, i.e. sufficient to produce the first signal. Thus, by varying the variable resistor 102, the first leakage resistance value or, in other words, the first leakage current value can be adjustingly set at a predetermined value and the first signal generating assembly 32 can be adjusted to generate and provide the first signal at various predetermined first leakage current values as desired in accordance with the requirements of a particular application.

The filter capacitor 104 provides a low impedance path for alternating current and thus functions to filter to ground most stray alternating currents which might be received via the first signal generating assembly 32. The Zener diode 106 protects the voltage comparator 108 by limiting and regulating the maximum voltage which can be applied to the input of the voltage comparator 108.

The voltage comparator 108 includes an operational amplifier 120, having a positive input terminal and a negative input terminal. The input network 118 is connected to the positive input terminal of the operational amplifier 120 via the conductor 98. The negative input terminal of the operational amplifier 120 is connected to a junction 122 via a conductor 124 and a resistor 126 is connected to the junction 122 and to the conductor 96, a capacitor 123 being connected in parallel with the resistor 126. The conductor 112 is connected to the operational amplifier 120 output terminal and the conductor 114 is connected to the junction 122, a resistor 125 being interposed in the conductor 114 between the connection of the relay 110 to the conductor 114 and the junction 122. A conductor 129 is connected to the positive operating power terminal of the operational amplifier 120 and to the conductor 114, generally between the resistor 125 and the connection of the relay 110 to the conductor 114, and a conductor 130 is connected to the negative operating power terminal of the operational amplifier 120 and to the conductor 96. An operational amplifier suitable for use in conjunction with the present invention is commercially available from such manufacturers as Precision Monolithics of Santa Clara, California, one suitable such operational amplifier being designated via the part number CMP-01, for example.

The indicator lamp 116 is connected to an alternating current operating power supply 127 via a pair of conductors 131 and 132. The relay 110, more particularly, includes a relay coil 133 and associated relay contacts 134, the relay coil 132 being interposed in the conductor 112 and the relay contacts 134 being interposed in the conductor 131 for interrupting electrical continuity between the indicator lamp 116 and the operating power supply 127 in the opened position of the relay contacts 134, as shown in the drawing, and establishing electrical continuity between the indicator lamp 116 and the operating power supply 127 in the closed position of the relay contacts 134 thereby illuminating the indicator lamp 116. The relay 110 is constructed such that the relay contacts 134 are in the opened position when the relay coil 133 is de-energized and the relay contacts 134 are in the closed position when the relay coil 133 is energized.

The first signal generating assembly 32 also includes a voltage regulator 136, having a portion connected to the conductor 114, a portion connected to a conductor 138 and a portion connected to ground via a conductor 140. The voltage regulator 136 is connected to the output of the voltage comparator 108 and functions to maintain the output terminal voltage of the voltage comparator 108 substantially constant over a range of current values. A bypass capacitor 142 is connected to the conductor 114, generally between the voltage regulator 136 and the connection between the relay coil 133 and the conductor 114, the bypass capacitor 142 also being connected to ground or, more particularly, to the conductor 96.

A capacitor 144 is connected to the conductor 138 and to the conductor 96. A diode 146 is interposed in the conductor 138 and a resistor 148 is interposed in the conductor 138 in series with the diode 146, the anode of the diode 146 being connected to the resistor 148 and the cathode of the diode 146 being connected to the connection between the conductor 138 and the capacitor 144. More particularly, the resistor 148 and the conductor 131 are each connected to a terminal 150 and the conductor 132 is connected to a terminal 152, the alternating current operating power supply 127 being connected to the terminals 150 and 152 via the conductors 154 and 156.

The diode 146, the capacitor 144 and the voltage regulator 136 cooperate to hold or maintain the voltage applied to the relay coil 133 via the output of the voltage comparator 108 substantially constant after the relay 110 has been energized, thereby maintaining the relay contacts 134 closed and the indicator lamp 116 illuminated after the first signal generating assembly 32 has received a signal indicating that a leakage resistance substantially equal to the first leakage resistance value exists in the electrical system 12. Thus, the diode 146, the capacitor 144 and the voltage regulator 136 function in cooperation with the relay coil 133 and the relay contacts 134 in the nature of a latching relay to maintain the relay contacts 134 closed, the diode 146 also functioning as a rectifier for providing a direct current signal in response to a received alternating current signal applied thereto via the alternating current power supply 127.

The amperage indicating device 38 receives the direct current signal representing the leakage current flowing through the electrical system 12 via the conductor 98, in a manner referred to before. In one embodiment, as schematically shown in the drawing, the amperage indicating device 38 is an ammeter, having a meter 158 portion providing a visually perceivable output indication indicating the direct current amperage connected to the amperage indicating device 38 in a manner well-known in the art. A pair of normally opened meter relay contacts 160 are connected to a pair of output terminals 162 and 164, and the amperage indicating device 38 includes a portion for applying a signal in the output terminals 162 and 164 to close the meter relay contacts 160 in response to a predetermined, set direct current value being received via the amperage indicating device 38. More particularly, the amperage indicating device 38 is set to apply a signal for closing the meter relay contacts 160 in response to a received predetermined direct current amperage value substantially equal to the second leakage current value and, in one embodiment, the amperage indicating device 38 is constructed such that, after the meter relay contacts 160 have been closed in response to a received second leakage current value, the meter relay contacts 160 will remain in the closed position until the meter relay is energized via a manually operatable release switch. Thus, the second signal generated and provided via the amperage indicating device 38 includes the visually perceivable output indication provided via the meter 158 and the signal applied at the output terminals 162 and 164 including the resulting closing of the meter relay contacts 160. The alternating current power supply 127 is connected to the amperage indicating device 38 via a pair of conductors 166 and 168 and provides the electrical power for operating the various internal components of the amperage indicating device 38 such as the meter relays or the like, for example.

As schematically and diagrammatically shown in the drawing, the electrical system 12 includes a controller 170 interposed in the conductor assembly 18 generally between the electrical power source 16 and the load 14. The controller 170 is manually positionable in one position establishing electrical continuity between the electrical power source 16 and the load 14 via the conductor assembly 18, and manually positionable in one other position interrupting electrical continuity between the electrical power source 16 and the load 14. The controller 170 also includes a portion which automatically positions the controller 170 for interrupting electrical continuity between the electrical power source 16 and the load 14 in response to a signal received via the conductors 172 and 174.

The control apparatus 10 is connected to the controller 170 via the conductors 172 and 174, and is constructed to provide the signal via the conductors 172 and 174 automatically positioning the controller 170 for interrupting electrical continuity between the electrical power source 16 and the load 14. More particularly, the second signal generating assembly 34 includes a relay 176 having a relay coil 178, a normally opened first pair of relay contacts 180 and a normally closed second pair of relay contacts 182.

The second relay contacts 182 are interposed between the conductors 172 and 174, and function to establish electrical continuity between the conductors 172 and 174 in the normally closed position of the second relay contacts 182 and to interrupt electrical continuity between the conductors 172 and 174 in the opened position of the second relay contacts 182, the opening of the second relay contacts 182 providing the signal for automatically positioning the controller 170 to interrupt electrical continuity between the electrical power source 16 and the load 14. The first relay contacts 180 are interposed in a conductor 184 and connected in electrical parallel with the meter relay contacts 160, the conductor 184 being connected to the output terminal 162 via a conductor 186 and being connected to the output terminal 164 via a conductor 188. The first relay contacts 180 are also connected to the alternating current operating power supply 127 or, more particularly, the first relay contacts 180 are connected to the conductor 168 via a conductor 190 which is connected to the conductor 168 and to the connection between the conductors 186 and 184. The relay coil 178 is interposed in a conductor 192 which is connected to the conductor 166 thereby connecting one side of the relay coil 178 to the alternating current operating power supply 127 and to the connection between the conductors 184 and 188 thereby connecting the other side of the relay coil 178 to the meter relay contacts 160.

When the amperage indicating device 38 receives a current substantially equal to the second leakage current value, the meter relay contacts 160 are closed thereby connecting the relay coil 178 to the alternating current operating power supply 127 via the conductor 192, the conductor 188, the meter relay contacts 160 and the conductors 186 and 190, the relay coil 176 being energized via the closing of the meter relay contacts 160 in response to a signal received via the amperage indicating device 38 in response to a second leakage resistance in the electrical system 12. In the energized condition of the relay coil 178, the first contacts 180 are closed and the second contacts 182 are opened, the opening of the second contacts 182 providing the signal to the controller 170 for automatically interrupting electrical continuity between the electrical power source 16 and the load 14 and the closing of the first contacts 180 connects the relay coil 178 to the alternating current operating power supply 127 via the conductor 192, the first contacts 180 and the conductor 190. Thus, the first contacts 180 operate to maintain or hold the relay coil 178 in an energized condition after the closing of the meter relay contacts 160 until the relay 176 is manually reset in the de-energized condition with the first contacts 180 opened and the second contacts 182 closed.

An amperage indicating device, having a meter and meter relay contacts, which is constructed and operates in a manner described above with respect to the amperage indicating device 38 is commercially available from such manufacturers as API Instruments Co. of Chesterland, Ohio, for example.

In summary, the control signal provided by the direct current power source 30 is connected to the electrical system 12 and the leakage current, if any, in the electrical system 12 flows through the leakage resistance to ground. The first and the second signal generating assemblies 32 and 34 are connected in electrical series to the direct current power source. Thus, the leakage resistance of the electrical system 12, the first and the second signal generating assemblies 32 and 34 and the direct current power source 30 are all connected in electrical series. Therefore, the current passing through the variable resistor 102 creates the input signal for the voltage comparator 108 indicative of the leakage resistance in the electrical system 12, the variable resistor 102 being adjusted to a predetermined resistance value so the voltage comparator 108 output signal is switched from the "low" to the "high" state energizing the relay 110 for illuminating the lamp 116 in response to the first leakage resistance value in the electrical system 12. The meter 158 provides a continuous visual output indication of the current flowing therethrough, thereby providing a continuous indication for monitoring the leakage resistance of the electrical system 12 (the meter 158, of course, provides an amperage output indication; however, the amperage indication is responsive to the leakage resistance in the electrical system 12, for reasons mentioned before). The amperage indicating device 38 closes the meter relay contacts 160 for energizing the relay 176 and positioning the controller 170 to disconnect the electrical power source 16 from the load 14 in response to the second leakage resistance value in the electrical system 12. The first and the second signals provided in response to the first and the second leakage resistance values in the electrical system 12 can be connected to a central control station or a central computer for monitoring a number of loads from a central location, if desired in a particular application.

The control apparatus 10 is useful for protecting electric motors (the load 14), particularly where the electric motors are installed in wet or moisture-laden conditions, since moisture frequently gets in the motor windings and reduces the leakage resistance to ground eventually resulting in the voltage on the motor windings shorting to ground and causing the virtual destruction of the motor windings and, in many instances, the iron components associated with the motor windings. If the electric motor is removed from service (disconnected from the electrical power source 16) prior to the motor windings being damaged as a result of the voltage impressed on the motor windings shorting to ground, the repair cost will be substantially reduced, and, in most instances, and, if the leakage resistance in the electric motor type of electrical system is monitored and detected at sufficiently high leakage resistance levels, the repair of the electric motors can be effectively scheduled prior to the failure of such electric motors, thereby increasing the efficiency of such maintenance procedures and reducing the possibility of unanticipated plant shut-downs due to the failure of the electric motors or other such components in the electrical system.

To further illustrate the various aspects of the present invention, assume the load 14 is an electric motor having a 200-ampere rating and designed for operation in conjunction with a 480-volt, 3-phase electric power source 16. In this type of electrical system, a circuit breaker and a starter with overload protection devices are generally interposed in the service conductors, such as the circuit breaker 20 and the overload protection device 22 interposed in the conductor assembly 18, for example. However, the overload protection device is generally constructed to disconnect the electric motor from the service conductors at an amperage level of approximately 125 percent of the rated capacity with a generally accepted tolerance of ±5 percent, i.e. 225 amperes, ±5 amperes (the electric motor generally being capable of receiving 125 percent of the rated amperage load). The circuit breaker generally utilizes thermal responsive circuit interrupting elements which necessarily have a delayed response time sufficient to sense the rising temperature level due to the increasing leakage current. In this example, a direct current control signal of 500 volts was connected to the service conductors (one of the conductors in the conductor assembly 18) and the amperage indicating device 38 was set to provide the second signal for disconnecting the electric motors from the electrical power source in response to a second leakage resistance value of one (1) megohm. Thus, the control apparatus 10 provided the second signal in response to a second leakage current value of $[(5)(10)^{-6}]$ amperes, in contrast with the overload protection device having an acceptable tolerance of ±5 amperes, for example. In this particular application, the variable resistor 102 of the control apparatus 10 was set to provide the first signal, i.e. the warning signal provided via the illumination of the lamp 116, at a first leakage resistance value of 1.2 megohm, the first signal generating assembly 32 being responsive to a first leakage current value of $[5/1.2)(10)^{-6}]$ amperes, in contrast with the overload protection device having an acceptable tolerance of ±5 amperes, for example. In this particular example, the control apparatus 10 can be constructed in accordance with the following circuit parameters:

1. A direct current power source 30 providing a 500 volt control signal at the output terminals 72 and 74;

2. A first transformer 42 receiving an alternating current signal at the primary windings having a voltage level of 440 volts and providing an alternating current signal at the secondary windings having a voltage level of 110 volts;

3. A second transformer 44 receiving an alternating current signal at the primary windings having a voltage level of 110 volts and providing an alternating current signal at the secondary windings having a voltage level of 440 volts;

4. A resistor 50 rated at 100 watts and having a resistance of 4.0 kilohms;

5. A resistor 82 having a resistance of 10.0 kilohms;

6. A capacitor 86 rated at 500 volts direct current;

7. A choke coil 84 having an inductance of 277 henries;

8. A test resistor 90 having a resistance of one (1) megohm;

9. A variable resistor 102 having a maximum resistance of 10 kilohm, the resistance value of the variable resistor 102 being set at 5.0 kilohms in this particular example and the first signal generating assembly 32 illuminating the lamp 116 in response to a leakage resistance of 1.2 megohm;

10. A filter capacitor 104 having a capacitance of 100 microfarads;
11. A Zener diode 106 rated at 5.0 volts;
12. A commercially available voltage comparator 108 manufactured by Precision Monolithics of Santa Clara, California, and designated via the part designation CMP-01;
13. A resistor 125 having a resistance of 100 kilohms;
14. A resistor 126 having a resistance of 33.0 kilohms;
15. A capacitor 123 having a capacitance of 10 microfarads;
16. A commercially available voltage regulator 136 rated at 5.0 volts manufactured by Motorola of Phoenix, Arizona, and designated via the part description MC 7805;
17. A bypass capacitor 142 having a capacitance of 10 microfarads;
18. A capacitor 144 having a capacitance of 100 microfarads; and
19. A resistor 148 having a resistance of 4.7 kilohms.

Changes may be made in the parts or elements described herein or in the steps of the method disclosed herein without departing from the spirit and the scope of the invention as defined in the following claims.

What is claimed is:

1. A control apparatus for providing an output indication responsive to the leakage resistance in an electrical system having an alternating current electrical power source connected to a load via a conductor assembly, the control apparatus comprising:

a direct current power source connected to the electrical system and impressing a direct current control signal on the electrical system;

means for providing an alternating current operating power supply; and signal generating means connected to the direct current power source and providing an output indication responsive to a predetermined leakage resistance value indicating a leakage resistance in the electrical system at least approximately equal to the predetermined leakage resistance value, the signal generating assembly including:

an amperage indicating device connected to the direct current power source providing a signal in response to receiving a current indicating a leakage resistance in the electrical system at least approximately equal to the predetermined leakage resistance value; and means receiving the signal from the amperage indicating device for interrupting electrical continuity between the load and the electrical power source in response to receiving the signal from the amperage indicating device, said means including:

a relay coil, having an energized condition and a de-energized condition, connected to the amperage indicating device for receiving the signal from the amperage indicating device, the relay coil being energized in response to the signal received from the amperage indicating device, the relay coil being connected to the means for providing the alternating current operating power supply in one condition, the relay coil being in the energized condition when connected to the alternating current operating power supply;

a pair of contacts, having an opened position and a closed position, the contacts being positioned in the closed position for establishing electrical continuity therebetween in the de-energized condition of the relay coil and the contacts being positioned in the opened position interrupting electrical continuity therebetween in the energized condition of the relay coil;

a controller interposed in the conductor assembly between the alternating current electrical power source and the load, having one condition interrupting electrical continuity between the alternating current electrical power source and the load and another condition establishing electrical continuity between the alternating current electrical power source and the load via the conductor assembly, the controller being connected to the contacts and being conditioned for establishing electrical continuity between the alternating current electrical power source and the load in the closed position of the contacts and the controller being conditioned for interrupting the electrical continuity between the alternating current electrical power source and the load in the opened position of the contacts; and meter relay contacts having an opened position and a closed position, connected to the amperage indicating device and interposed between the relay coil and the alternating current operating power supply, electrical continuity being established between the relay coil and the alternating current operating power supply in the closed position of the meter relay contacts thereby energizing the relay coil and electrical continuity being interrupted between the relay coil and the alternating current operating power supply in the opened position of the meter relay contacts, the meter relay contacts being closed via the amperage indicating device in response to the amperage indicating device receiving a current indicating a leakage resistance in the electrical system at least approximately equal to the predetermined leakage resistance value. value and interposed between the relay coil and the alternating current operating power supply, electrical continuity being established between the relay coil and the alternating current operating power supply in the closed position of the relay contacts thereby energizing the relay coil and electrical continuity being interrupted between the relay coil and the alternating current operating power supply in the opened position of the relay contacts, the relay contacts being closed in response to receiving a current indicating a leakage resistance in the electrical system at least approximately equal to the predetermined leakage resistance value.

2. The control apparatus of claim 1 wherein the signal generating means is defined further to include:

a first pair of contacts connected in electrical parallel with the meter relay contacts and connected to the alternating current operating power supply, the first contacts being connected to the relay coil and having an opened position and a closed position, the first contacts being closed in the energized condition of the relay coil thereby establishing electrical continuity between the relay coil and the alternating current operating power supply for holding the relay coil in the energized condition subsequent to the relay coil being energized in response to the signal provided via the amperage indicating device.

3. A control apparatus for providing an output indication responsive to the leakage resistance in an electrical system having an alternating current electrical power source connected to a load via a conductor assembly, the control apparatus comprising:

a direct current power source connected to the electrical system and impressing a direct current control signal on the electrical system;

means for providing an alternating current operating power supply; and signal generating means connected to the direct current power source and providing an output indication responsive to a predetermined leakage resistance value indicating a leakage resistance in the electrical system at least approximately equal to the predetermined leakage resistance value, the signal generating assembly including:

means connected to the direct current power source providing a signal in response to receiving a current indicating a leakage resistance in the electrical system at least approximately equal to the predetermined leakage resistance value; and means receiving the signal indicating a leakage resistance in the electrical system at least equal to the predetermined leakage resistance value for interrupting electrical continuity between the load and the electrical power source in response to receiving the said signal, said means including:

a relay coil, having an energized condition and a de-energized condition, connected to the means for providing the signal indicating a leakage resistance in the electrical system at least equal to the predetermined leakage resistance value, the relay coil receiving the signal indicating a leakage resistance in the electrical system at least equal to the predetermined leakage resistance value and the relay coil being energized in response to the received said signal, the relay coil being connected to the means for providing the alternating current operating power supply in one condition, and the relay coil being in the energized condition when connected to the alternating current operating power supply;

a pair of contacts, having an opened position and a closed position, the contacts being positioned in the closed position for establishing electrical continuity therebetween in the de-energized condition of the relay coil and the contacts being positioned in the opened position interrupting electrical continuity therebetween in the energized condition of the relay coil;

a controller interposed in the conductor assembly between the alternating current electrical power source and the load, having one condition interrupting electrical continuity between the alternating current electrical power source and the load and another condition establishing electrical continuity between the alternating current electrical power source and the load via the conductor assembly, the controller being connected to the contacts and being conditioned for establishing electrical continuity between the alternating current electrical power source and the load in the closed position of the contacts and the controller being conditioned for interrupting the electrical continuity between the alternating current electrical power source and the load in the opened position of the contacts; and relay contacts having an opened position and a closed position, connected to the means for providing the signal indicating a leakage resistance in the electrical system at least equal to the predetermined leakage resistance value and interposed between the relay coil and the alternating current operating power supply, electrical continuity being established between the relay coil and the alternating current operating power supply in the closed position of the relay contacts thereby energizing the relay coil and electrical continuity being interrupted between the relay coil and the alternating current operating power supply in the opened position of the relay contacts, the relay contacts being closed in response to receiving a current indicating a leakage resistance in the electrical system at least approximately equal to the predetermined leakage resistance value.

a first pair of contacts connected in electrical parallel with the relay contacts and connected to the alternating current operating power supply, the first contacts being connected to the relay coil and having an opened position and a closed position, the first contacts being closed in the energized condition of the relay coil thereby establishing electrical continuity between the relay coil and the alternating current operating power supply for holding the relay coil in the energized condition subsequent to the relay coil being energized in response to the signal provided via the means for providing the signal indicating a leakage resistance in the electrical system at least equal to the predetermined leakage resistance value.

* * * * *